(12) United States Patent
Wang et al.

(10) Patent No.: US 9,865,476 B2
(45) Date of Patent: Jan. 9, 2018

(54) METHOD AND APPARATUS FOR PULSE ELECTROCHEMICAL POLISHING

(75) Inventors: Jian Wang, Shanghai (CN); Yinuo Jin, Shanghai (CN); Jun Wang, Shanghai (CN); Hui Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 441 days.

(21) Appl. No.: 14/402,853

(22) PCT Filed: May 24, 2012

(86) PCT No.: PCT/CN2012/075990
§ 371 (c)(1),
(2), (4) Date: Nov. 21, 2014

(87) PCT Pub. No.: WO2013/173998
PCT Pub. Date: Nov. 28, 2013

(65) Prior Publication Data
US 2015/0155183 A1    Jun. 4, 2015

(51) Int. Cl.
*H01L 21/321* (2006.01)
*C25F 3/16* (2006.01)
*C25F 7/00* (2006.01)
*H01L 21/66* (2006.01)
*C25F 3/30* (2006.01)

(52) U.S. Cl.
CPC .......... *H01L 21/32115* (2013.01); *C25F 3/16* (2013.01); *C25F 3/30* (2013.01); *C25F 7/00* (2013.01); *H01L 22/12* (2013.01); *H01L 22/20* (2013.01)

(58) Field of Classification Search
USPC ............................ 205/651, 670; 204/228.7
See application file for complete search history.

(56) References Cited

U.S. PATENT DOCUMENTS

| | | |
|---|---|---|
| 5,851,319 A | 12/1998 | Atwater et al. |
| 6,402,931 B1 | 6/2002 | Zhou et al. |
| 6,546,306 B1 * | 4/2003 | Bushman ................ B24B 49/00 438/624 |

(Continued)

OTHER PUBLICATIONS

International Search Report issued in PCT/CN2012/075990 dated Feb. 28, 2013 (3 pages).

(Continued)

*Primary Examiner* — Nicholas A Smith
(74) *Attorney, Agent, or Firm* — Osha Liang LLP

(57) ABSTRACT

A method and apparatus for pulse electrochemical polishing a wafer are disclosed. The method comprises steps of: establishing a duty cycle table showing all points on the wafer, a removal thickness corresponding to every point and a duty cycle corresponding to the removal thickness; driving a wafer chuck holding and positioning the wafer to move at a preset speed so that a special point on the wafer is right above a nozzle ejecting charged electrolyte onto the wafer; looking up the duty cycle table and obtaining the removal thickness and the duty cycle corresponding to the special point; and applying a preset pulse power source to the wafer and the nozzle and the actual polishing power source for polishing the special point being equal to the duty cycle multiplying by the preset power source.

14 Claims, 6 Drawing Sheets

(56) References Cited

U.S. PATENT DOCUMENTS

| | | | |
|---|---|---|---|
| 2004/0125384 A1* | 7/2004 | Wang | B24B 37/013 356/636 |
| 2005/0221608 A1 | 10/2005 | Katagiri et al. | |
| 2005/0245086 A1* | 11/2005 | Wang | B23H 5/08 438/690 |
| 2007/0125661 A1 | 6/2007 | Wang et al. | |

OTHER PUBLICATIONS

Office Action issued in Chinese Application No. 201280073426.9; dated May 26, 2016 (5 pages).

* cited by examiner

Estimated Removal Thickness Table

| Points | Removal thickness (Angstrom) |
|---|---|
| 0 | 2000 |
| 1 | 1900 |
| 2 | 1950 |
| 3 | 2130 |
| 4 | 1850 |
| 5 | 1570 |
| 6 | 1500 |
| 7 | 1800 |
| 8 | 1900 |
| 9 | 1270 |
| 10 | 2400 |
| 11 | 1580 |
| . | . |
| . | . |
| . | . |

FIG 3

| Duty cycle (%) | Removal thickness (Angstrom) |
|---|---|
| 0 | 0 |
| 20 | 500 |
| 40 | 1000 |
| 60 | 1500 |
| 80 | 2000 |
| 100 | 2500 |

FIG 4

METHOD AND APPARATUS FOR PULSE ELECTROCHEMICAL POLISHING

BACKGROUND OF THE INVENTION

1. Field of the Invention

The present invention generally relates to a method and apparatus for polishing metal layers deposited on wafers, and more particularly relates to a method and apparatus for pulse electrochemical polishing for fabricating semiconductor devices.

2. The Related Art

As known to all, a deposition process is an absolutely necessary process for fabricating a semiconductor device, which is performed to deposit a metal layer in trenches and vias and also on non-recessed areas of a wafer. To isolate interconnections formed on the wafer, the metal layer deposited on the non-recessed areas of the wafer needs to be removed. Generally, the metal layer is deposited on a dielectric layer of the wafer. Accordingly, the metal layer deposited on non-recessed areas of the dielectric layer needs to be removed.

To remove the metal layer deposited on the non-recessed areas of the dielectric layer, a chemical mechanical polishing (CMP) method is used and includes steps of: providing a rotatable table, a polishing pad disposed on the rotatable table, a wafer carrier head for gripping the wafer and a slurry feeder providing slurry between the wafer and the polishing pad; applying a downward press force on the wafer carrier head to press the wafer against the polishing pad, which enforces the wafer to rotate relatively to the polishing pad. Then, the wafer is polished.

However, for continually shrinking the feature dimension of the semiconductor devices, Cu and low-k dielectic or ultra low-k dielectric are used in the semiconductor device fabrication. Because the Cu and the low-k dielectic or the ultra low-k dielectric have very weak mechanical stress, so the downward press force acted on the wafer carrier head in the CMP process will damage the Cu and the low-k dielectic or the ultra low-k dielectric.

To solve the above problem, an electrochemical polishing method is employed to remove the metal layer on the non-recessed areas of the dielectric layer. Firstly, provide a wafer chuck for holding the wafer thereon and a nozzle arranged in a polishing chamber for ejecting electrolyte on the metal layer of the wafer. The wafer chuck can linearly move in a horizontal direction and rotate during the electrochemical polishing process. A power supply electrically connects with the wafer chuck and the nozzle. The wafer chuck electrically connects the anode of the power supply and the wafer and the nozzle electrically connects the cathode of the power supply and charges the electrolyte. The electrochemical polishing method utilizes the chemical reaction between the electrolyte and the metal layer to polish the metal layer. In the polishing process, only the electrolyte contacts with the metal layer, so the metal layer can be removed without mechanical stress, solving the Cu and the low-k dielectic or the ultra low-k dielectric integration issue.

Generally, the motion speed of the wafer chuck and the electric current/voltage provided by the power supply dominate the removal thickness of the metal layer. The electric current/voltage set value will be changed according to the metal layer thickness on the non-recessed areas of the dielectric layer. If a wafer surface topography is not uniform, for example, there are humps and valleys on a post-plating pattern wafer, due to the metal layer thickness is huge difference in adjacent regions and the wafer rotates at a high speed during the polishing process, the electric current/voltage should be changed rapidly and discretely in a very short time to match the wafer topography thickness change. Actually, it is very hard to make the electric current/voltage be changed rapidly and discretely in a very short time. As a result, the method is only suitable for polishing a blanket wafer but can't accurately polish the post-plating pattern wafer.

SUMMARY OF THE INVENTION

In accordance with one aspect of the present invention is to provide a method for pulse electrochemical polishing a wafer. The method comprises the following steps: establishing a duty cycle table showing all points on the wafer, a removal thickness corresponding to every point and a duty cycle corresponding to the removal thickness; driving a wafer chuck holding and positioning the wafer to move at a preset speed so that a special point on the wafer is right above a nozzle ejecting charged electrolyte onto the wafer; looking up the duty cycle table and obtaining the removal thickness and the duty cycle corresponding to the special point; and applying a preset pulse power source to the wafer and the nozzle and the actual polishing power source for polishing the special point being equal to the duty cycle multiplying by the preset power source.

In accordance with another aspect of the present invention is to provide an apparatus for pulse electrochemical polishing the wafer. The apparatus includes a wafer chuck for holding and positioning the wafer, a nozzle for charging and ejecting electrolyte onto the wafer, a power supply for providing a pulse power source to the wafer and the nozzle, and a host computer for storing a duty cycle table showing all points on the wafer, a removal thickness corresponding to every point and a duty cycle corresponding to the removal thickness, and controlling the actual polishing power source provided by the power supply based on the duty cycle table.

As described above, through the host computer controlling the actual polishing power source provided by the power supply based on the duty cycle table, the actual polishing power source can be changed rapidly and discretely to remove the corresponding thickness of a metal layer on the wafer. Then the removal thickness of each point on the wafer is controlled accurately. The polishing precision and uniformity are observably improved and the method and apparatus are suitable for polishing a post-plating pattern wafer.

BRIEF DESCRIPTION OF THE DRAWINGS

The present invention will be apparent to those skilled in the art by reading the following description of a preferred embodiment thereof, with reference to the attached drawings, in which:

FIG. 3 is an estimated removal thickness table illustrating the corresponding relation between the points on the wafer and the removal thickness;

FIG. 4 is a table illustrating the corresponding relation between the duty cycle and the removal thickness;

DETAILED DESCRIPTION OF EMBODIMENTS

Figure 1:
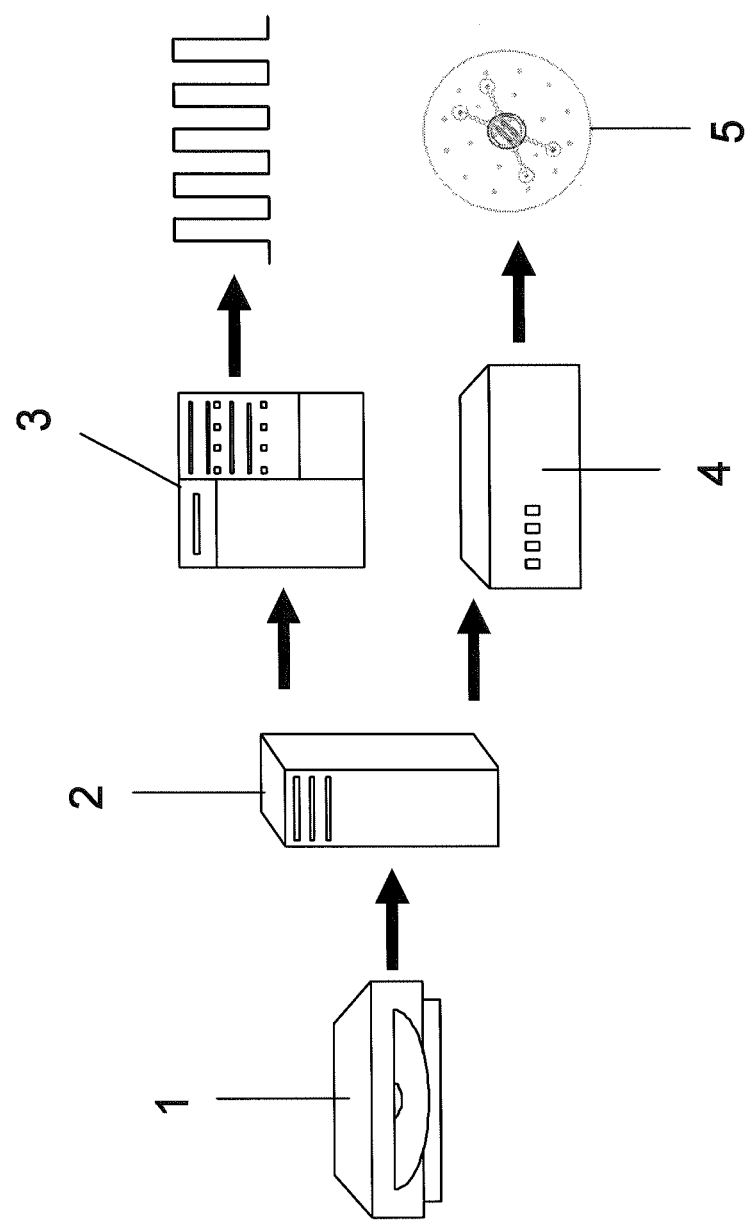
FIG. 1 is a schematic view illustrating an apparatus for pulse electrochemical polishing according to the present invention.
Figure 2:
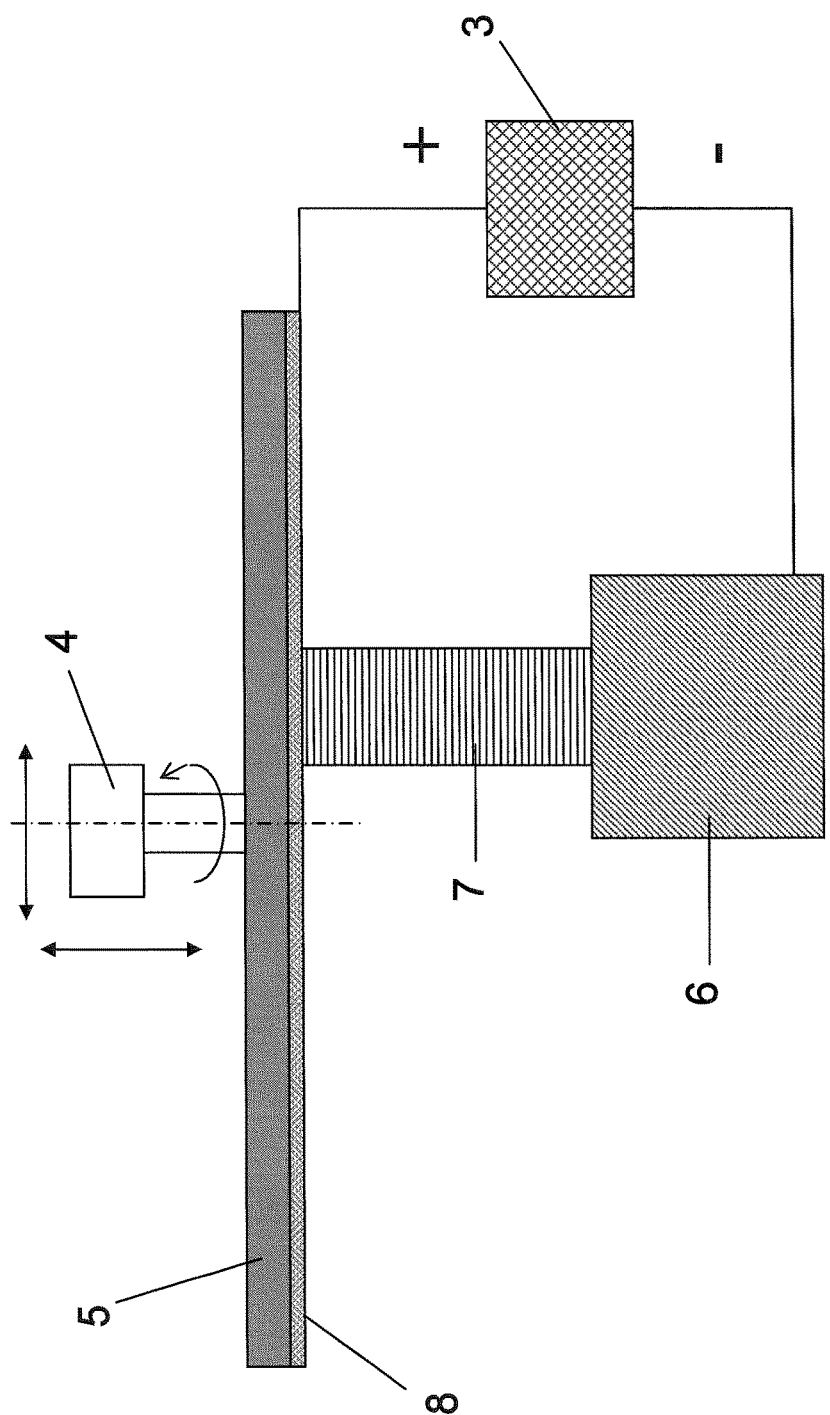
FIG. 2 is another schematic view illustrating the apparatus for pulse electrochemical polishing.

Referring to FIGS. 1-2, an apparatus for pulse electrochemical polishing according to an embodiment of the present invention is illustrated. The apparatus includes a thickness meter 1 for measuring the thickness of an unwanted metal layer on a wafer 8, a host computer 2, a power supply 3 providing a direct-current (DC) pulse power source, a motion controller 4 and a wafer chuck 5 for holding and positioning the wafer 8. The thickness meter 1 is a non-contact thickness meter or a contact thickness meter.

As illustrated in FIG. 2, the wafer 8 is fixed on the wafer chuck 5. The motion controller 4 drives the wafer chuck 5 to rotate or move horizontally or vertically. A nozzle 6 is disposed below the wafer 8 for ejecting electrolyte 7 onto the metal layer on the wafer 8. The anode of the power supply 3 electrically connects with the wafer 8 and the cathode of the power supply 3 electrically connects with the nozzle 6 to charge the electrolyte 7. The charged electrolyte 7 is ejected onto the metal layer to form a circuit to polish the metal layer. In this invention, the apparatus for pulse electrochemical polishing is an exemplary apparatus. US patent publication No. 2007/0125661 discloses several exemplary electrochemical polishing tools which are also suitable for this invention.

Please refer to FIGS. 3-6. A method for pulse electrochemical polishing will be described.

Figure 6:
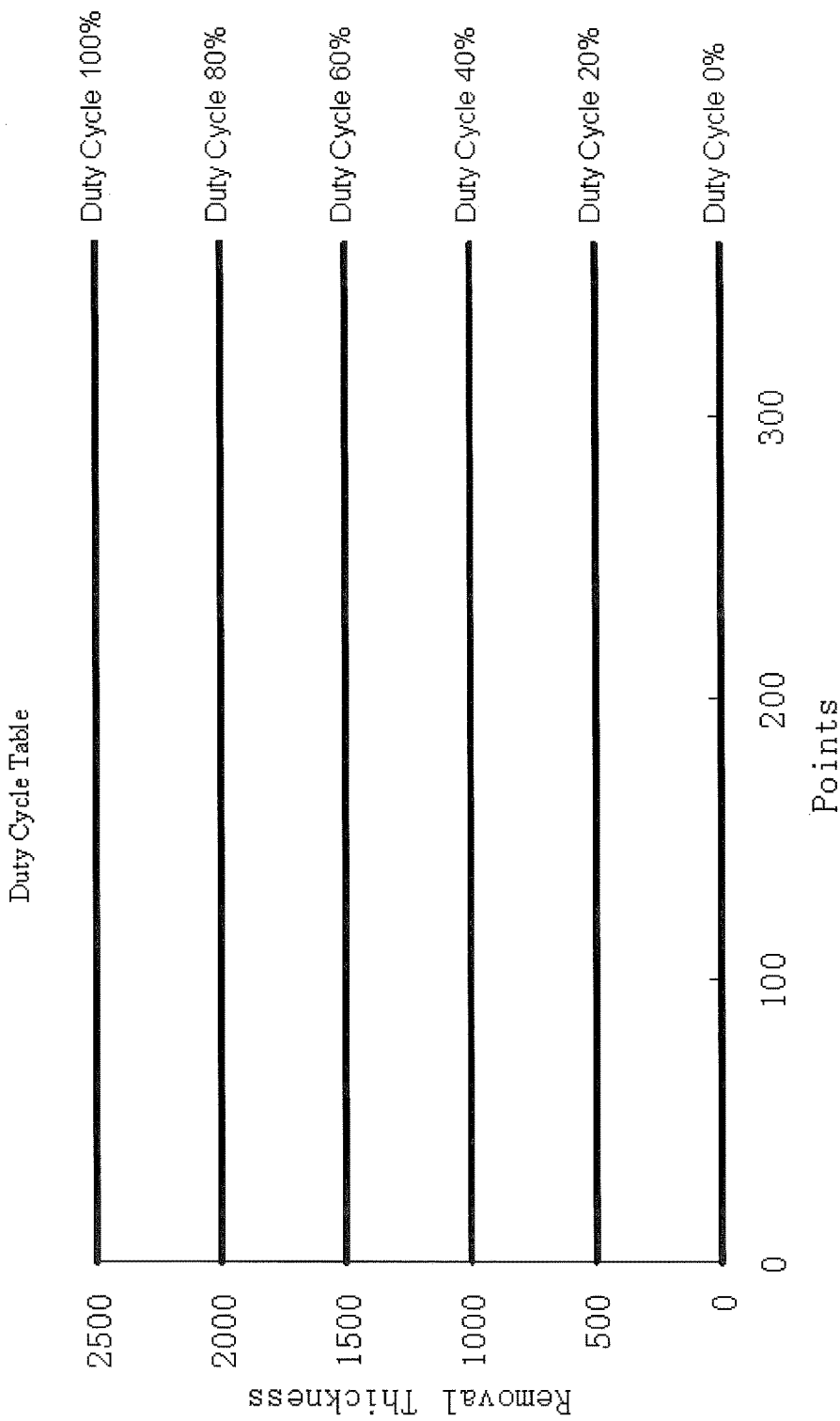
FIG. 6 is a schematic view illustrating the corresponding relation between the points on the wafer, the removal thickness and the duty cycle.

Firstly, establish a duty cycle table stored in the host computer 2 through lots of optimal experiments before polishing the unwanted metal layer. The duty cycle table shows all points on the wafer 8, a removal thickness corresponding to every point and a duty cycle corresponding to the removal thickness. That is to say, every point on the wafer 8 has a special removal thickness and a special duty cycle, as shown in FIG. 6. A method for establishing the duty cycle table includes the following steps.

Measure the removal thickness of the metal layer on the wafer 8 by using the thickness meter 1. Generally, the thickness meter 1 measures the removal thickness of about 49 points to 625 points on the global wafer 8. Then the measured result is sent to the host computer 2. Based on an interpolation mechanism, the host computer 2 computes the corresponding removal thickness of all points on the entire wafer 8 (about 10000 points or more). Every point on the wafer 8 is corresponding to a special removal thickness of the metal layer which needs to be removed.

Figure 5:
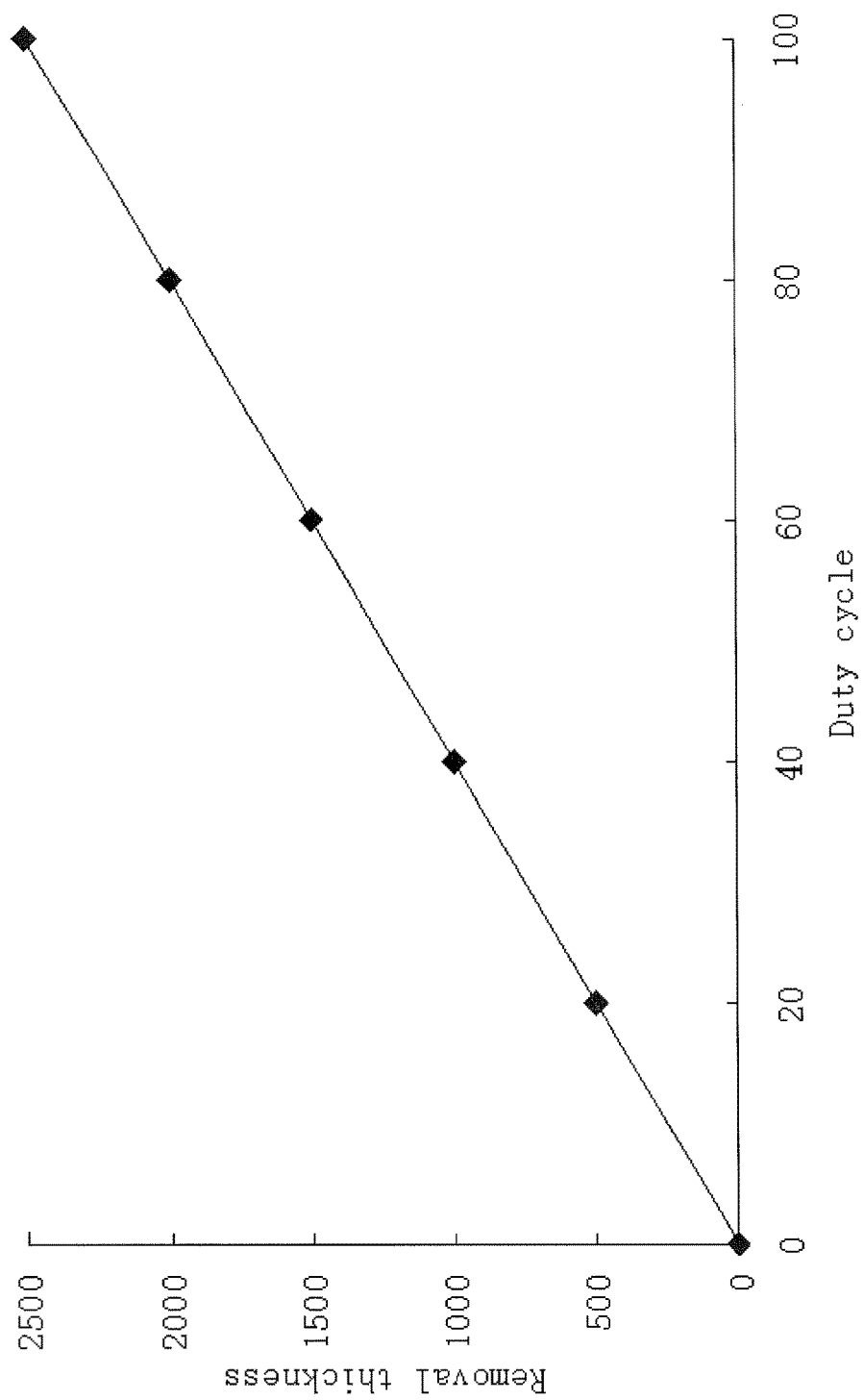
FIG. 5 is a graph illustrating the linear relation between the duty cycle and the removal thickness.

Obtain a linear function model of the removal thickness and the duty cycle. According to a preset power source provided by the power supply 3 and a preset horizontal movement speed of the wafer chuck 5, through lots of optimal experiments, the one-to-one corresponding relation between the removal thickness and the duty cycle is obtained, as shown in FIG. 4, and while the removal thickness increases, the duty cycle linearly proportionally increases, which is shown in FIG. 5. Then the linear function model is obtained.

Store the linear function model in the host computer 2 and the host computer 2 converts the removal thickness of every point on the wafer 8 into a corresponding duty cycle. Then the duty cycle table is established.

After establishing the duty cycle table, the method for pulse electrochemical polishing further includes steps of:

Drive the wafer chuck 5 horizontally to move at the preset speed by using the motion controller 4. When the wafer chuck 5 moves to a special portion, a special point on the wafer 8 is right above the nozzle 6.

Look up the duty cycle table and the removal thickness and the duty cycle corresponding to the special point are obtained.

Provide the preset power source to the wafer 8 and the nozzle 6 by using the power supply 3 which is controlled by the host computer 2. The actual polishing power source for polishing the special point is equal to the duty cycle multiplying by the preset power source provided by the power supply 3. The power source referred in this invention is a DC pulse electric current or voltage.

As described above, through obtaining the removal thickness of all points on the global wafer 8 and converting the metal layer removal thickness of the global wafer 8 into the corresponding duty cycle, the actual polishing power source is changed rapidly and discretely to remove the corresponding thickness of the metal layer on the wafer 8. Then the removal thickness of each point on the wafer 8 is controlled accurately. The polishing precision and uniformity are observably improved and the method is suitable for polishing a post-plating pattern wafer.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A method for pulse electrochemical polishing a wafer, comprising:
    establishing a duty cycle table showing 10,000 or more points on the wafer, a removal thickness corresponding to every point and a duty cycle corresponding to the removal thickness, wherein the step of establishing a duty cycle table further comprises steps of:
        measuring the removal thickness of a number of points on the wafer and then computing the removal thickness of each of the 10,000 or more points on the wafer based on the measured removal thickness;
        obtaining a linear function model of the removal thickness and duty cycle; and
        storing the linear function model and converting the removal thickness of each of the 10,000 or more points on the wafer into a corresponding duty cycle according to the linear function model;
    driving a wafer chuck holding and positioning the wafer to move at a preset speed so that a special point on the wafer is right above a nozzle ejecting charged electrolyte onto the wafer;
    looking up the duty cycle table to obtain the removal thickness and the duty cycle corresponding to the special point; and
    applying a preset pulse power source to the wafer and the nozzle and the actual polishing power source for polishing the special point being equal to the duty cycle multiplying by the preset power source.

2. The method as claimed in claim 1, wherein the step of measuring the removal thickness of a number of points on the wafer further includes measuring the removal thickness of the number of points on the wafer by using a thickness meter.

3. The method as claimed in claim 2, wherein the thickness meter is a non-contact thickness meter.

4. The method as claimed in claim 2, wherein the thickness meter is a contact thickness meter.

5. The method as claimed in claim 1, wherein the step of computing the removal thickness of all points on the wafer further includes computing the removal thickness of each of the 10,000 or more points on the wafer by using an interpolation mechanism.

6. The method as claimed in claim 1, wherein the preset pulse power source is a DC pulse electric current.

7. The method as claimed in claim 1, wherein the preset pulse power source is a DC pulse voltage.

8. An apparatus for pulse electrochemical polishing a wafer, comprising:
 a wafer chuck, for holding and positioning the wafer;
 a nozzle, for charging and ejecting electrolyte onto the wafer;
 a power supply, for providing a pulse power source to the wafer and the nozzle; and
 a host computer, for:
  storing a duty cycle table showing 10,000 or more points on the wafer, a removal thickness corresponding to each of the 10,000 or more points based on a measured removal thickness of a number of points on the wafer, and a duty cycle corresponding to the removal thickness,
  storing a linear function model of the removal thickness and duty cycle,
  converting the removal thickness of each of the 10,000 or more points on the wafer into a corresponding duty cycle according to the linear function model,
  controlling the wafer chuck to move at a preset speed so that a special point on the wafer is right above a nozzle electing charged electrolyte onto the wafer, and
  controlling the actual polishing power source provided by the power supply based on the duty cycle table to apply a preset pulse power source to the wafer and the nozzle and the actual polishing power source for polishing the special point being equal to the duty cycle multiplying by the preset power source.

9. The apparatus as claimed in claim 8, further comprising a thickness measuring apparatus for measuring the removal thickness of a number of points on the wafer.

10. The apparatus as claimed in claim 8, wherein the pulse power source is a DC pulse electric current.

11. The apparatus as claimed in claim 8, wherein the pulse power source is a DC pulse voltage.

12. The apparatus as claimed in claim 9, wherein the thickness measuring apparatus is a non-contact thickness meter.

13. The apparatus as claimed in claim 9, wherein the thickness measuring apparatus is a contact thickness meter.

14. The apparatus as claimed in claim 9, wherein the host computer computes the removal thickness of each of the 10,000 or more points on the wafer by using an interpolation mechanism.

* * * * *